(12) United States Patent
Chun et al.

(10) Patent No.: US 10,505,447 B2
(45) Date of Patent: Dec. 10, 2019

(54) ANALOG TO DIGITAL (A/D) CONVERTER AND POWER CONVERSION APPARATUS HAVING THE SAME

(71) Applicants: Hyundai Motor Company, Seoul (KR); Kia Motors Corporation, Seoul (KR)

(72) Inventors: ShinHye Chun, Jeollanam (KR); Hyung Bin Ihm, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/117,402

(22) Filed: Aug. 30, 2018

(65) Prior Publication Data

US 2019/0252976 A1  Aug. 15, 2019

(30) Foreign Application Priority Data

Feb. 13, 2018 (KR) .................. 10-2018-0017477

(51) Int. Cl.
*H02M 3/157* (2006.01)
*H03M 3/00* (2006.01)
*H03H 17/06* (2006.01)

(52) U.S. Cl.
CPC ........ *H02M 3/157* (2013.01); *H03H 17/0671* (2013.01); *H03M 3/43* (2013.01); *H03M 3/458* (2013.01)

(58) Field of Classification Search
USPC .......................... 323/283, 285; 341/142, 143
See application file for complete search history.

(56) References Cited

U.S. PATENT DOCUMENTS

| 5,590,065 A * | 12/1996 | Lin | .................... H03H 17/0286 708/313 |
| 9,608,598 B1 * | 3/2017 | Melanson | .......... H03H 17/0427 |
| 2011/0103593 A1 * | 5/2011 | Sutharsan | ............... G06F 3/162 381/23 |
| 2012/0153917 A1 * | 6/2012 | Adell | .................. H02M 3/1588 323/283 |

(Continued)

FOREIGN PATENT DOCUMENTS

| DE | 102016120129 A1 | 4/2017 |
| JP | 2012065038 A * | 3/2012 |

OTHER PUBLICATIONS

Lattice Semiconductor, "Simple Sigma-Delta ADC", Reference Design RD1066, Nov. 2010, pp. 1-6.

(Continued)

*Primary Examiner* — Howard Williams
(74) *Attorney, Agent, or Firm* — Mintz Levin Cohn Ferris Glovsky and Popeo, P.C.; Peter F. Corless (57) ABSTRACT

A power conversion apparatus can include: a power module configured to transfer an analog sensing signal corresponding to a current of an inductor and a voltage applied at both terminals of a capacitor, and to perform power conversion by driving a power semiconductor with a pulse-width modulation signal; and a controller configured to receive the analog sensing signal from the power module, to convert the analog sensing signal to a digital signal, to generate the pulse-width modulation signal, and to transfer the pulse-width modulation signal to the power module.

11 Claims, 8 Drawing Sheets

(56) References Cited

U.S. PATENT DOCUMENTS

| | | | |
|---|---|---|---|
| 2014/0035548 A1* | 2/2014 | Oaklander | H03K 17/063 |
| | | | 323/283 |
| 2015/0180503 A1* | 6/2015 | Schubert | H03M 3/46 |
| | | | 341/143 |
| 2017/0063228 A1* | 3/2017 | Kimura | H02M 3/158 |
| 2017/0117812 A1* | 4/2017 | Furtner | H02M 3/33515 |

OTHER PUBLICATIONS

"Extended European Search Report issued in European Application No. 18194219.4", dated Mar. 29, 2019, 15 pages.

\* cited by examiner

ANALOG TO DIGITAL (A/D) CONVERTER AND POWER CONVERSION APPARATUS HAVING THE SAME

CROSS-REFERENCE TO RELATED APPLICATION

This application is based on and claims the benefit of priority under 35 U.S.C. § 119 to Korean Patent Application No. 10-2018-0017477, filed on Feb. 13, 2018 in the Korean Intellectual Property Office, the disclosure of which is incorporated by reference herein in its entirety.

BACKGROUND

1. Technical Field

The present disclosure relates to an Analog to Digital (A/D) converter and a power conversion apparatus having the same and, more particularly, to an A/D converter to which an A/D conversion method for improving the use efficiency of a logic block is applied, and a power conversion apparatus having the same.

2. Description of the Related Art

There is a need for high-speed switching of a DC-DC converter (e.g., according to power density, etc.) to reduce the size of the converter. Power semiconductors, such as SiC and GaN, have been developed to meet this need. However, the ability to increase switching frequency is restrained due to limited resources in digital control using microprocessors.

In order to overcome the problem, a Field Programmable Gate Array (FPGA) can be used to generate high-speed Pulse Width Modulation (PWM) signals. The FPGA can perform parallel processing, and accordingly, the FPGA can perform tasks simultaneously at high speed.

However, since the FPGA is still at the stage of growth in industry, the FPGA remains expensive compared to microprocessors allowing multiple-purpose control. Accordingly, a method for efficiently using resources so that required control performance can be achieved with a limited number of logic blocks of a FPGA, without significant increases in cost, is needed.

SUMMARY

Therefore, it is an aspect of the present disclosure to provide an Analog to Digital (A/D) converter to which an A/D conversion method for improving the use efficiency of a logic block is applied, and a power conversion apparatus having the same.

Additional aspects of the disclosure will be set forth in part in the description which follows and, in part, will be apparent from the description, or may be learned by practice of the disclosure.

In accordance with embodiments of the present disclosure, a power conversion apparatus may include: a power module configured to transfer an analog sensing signal corresponding to a current of an inductor and a voltage applied at both terminals of a capacitor, and to perform power conversion by driving a power semiconductor with a pulse-width modulation signal; and a controller configured to receive the analog sensing signal from the power module, to convert the analog sensing signal to a digital signal, to generate the pulse-width modulation signal, and to transfer the pulse-width modulation signal to the power module.

The controller may include an Analog to Digital (A/D) converter may convert the analog sensing signal to the digital signal through a delta sigma modulation method.

The A/D converter may include: a delta sigma modulator may convert the analog sensing signal to the digital signal by converting an analog input signal to a 1-bit signal through a delta and a sigma signal for integrating the delta, wherein the delta is a difference between the analog input signal and a modulation signal that is feedback of the delta; and a digital filter may smooth the 1-bit signal.

The digital filter may be a Cascaded Integrator Comb (CIC) filter.

The delta sigma converter may include: an analog circuit including an adder and an integrator implemented with a register and a capacitor; a comparator may output a signal transferred from the analog circuit as the 1-bit signal; a quantizer configured to oversample the 1-bit signal transferred from the comparator; and an out port configured to RC-filter the oversampled value, and to feed the RC-filtered value back as a delta input.

The analog circuit may include a first register configured to receive the analog input signal, a capacitor connected to the first register at one end thereof, and a second register connected between the first register and the capacitor at one end thereof.

The comparator may include a Low Voltage Differential Signaling (LVDS) terminal having a non-inverting input terminal connected to one end of the capacitor as an input terminal.

The quantizer may include a Delay (D) flipflop including an input terminal connected to an output terminal of the LVDS terminal, a first output terminal connected to the digital filter, and a second output terminal connected to the other end of the second register through the out port.

When the controller is implemented as a digital controller, the analog circuit may be disposed outside the digital controller, and the comparator, the quantizer, the out port, and the digital filter may be disposed inside the digital controller.

The digital filter may be with a filter of a predetermined order, including a plurality of integrator stages configured to sequentially provide outputs from a predetermined number of integrators as input of a common Comb filter, and a comb stage configured to generate a comb valid signal in synchronization with a decimation ratio of the plurality of integrator stages and to selectively apply an input according to predetermined criteria for outputs from the plurality of integrator stages when a signal is generated to provide a final output.

The digital filter may include random access memory (RAM) configured to store an input to or an output from the plurality of integrator stages and the comb stage.

The RAM selectively stores the outputs from the plurality of integrator stages in corresponding addresses according to criteria set in advance by a valid signal.

Furthermore, in accordance with an aspect of the present disclosure, an Analog to Digital (A/D) converter includes: a delta sigma modulator configured to convert an analog sensing signal to a digital signal, in such a way to convert an analog input signal to a 1-bit signal through delta which is a difference between the analog input signal and a modulation signal that is feedback of the delta and a sigma signal for integrating the delta; and a digital filter configured to smooth the 1-bit signal.

The digital filter may be a Cascaded Integrator Comb (CIC) filter.

The delta sigma modulator may include: an analog circuit including an adder and an integrator implemented with a register and a capacitor; a comparator configured to output a signal transferred from the analog circuit as a 1-bit signal; a quantizer configured to oversample the 1-bit signal transferred from the comparator; and an out port configured to RC-filter the oversampled value, and to feed the RC-filtered value back as a delta input.

When the A/D converter is implemented as a digital controller, the analog circuit may be disposed outside the digital controller, and the comparator, the quantizer, the out port, and the digital filter may be disposed inside the digital controller.

The digital filter may be with a filter of a predetermined order, including a plurality of integrator stages configured to sequentially provide outputs from a predetermined number of integrators as input of a common Comb filter, and a comb stage configured to generate a comb valid signal in synchronization with a decimation ratio of the plurality of integrator stages and selectively applying an input according to predetermined criteria for outputs from the plurality of integrator stages when a signal is generated to provide a final output.

The digital filter may include random access memory (RAM) configured to store an input to or an output from the plurality of integrator stages and the comb stage.

BRIEF DESCRIPTION OF THE DRAWINGS

These and/or other aspects of the disclosure will become apparent and more readily appreciated from the following description of the embodiments, taken in conjunction with the accompanying drawings of which.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Hereinafter, embodiments of the present disclosure will be described in detail with reference to the accompanying drawings. As those skilled in the art would realize, the described embodiments may be modified in various different ways, all without departing from the spirit or scope of the present disclosure. Further, throughout the specification, like reference numerals refer to like elements.

Like numbers refer to like elements throughout this specification. This specification does not describe all components of the embodiments, and general information in the technical field to which the present disclosure belongs or overlapping information between the embodiments will not be described. The terms "portion", "module", "element", and "block", as used herein, may be implemented as software or hardware, and according to embodiments, a plurality of "portion", "module", "element", and "block" may be implemented as a single component, or a single "portion", "module", "element", and "block" may include a plurality of components.

It will be understood that when a component is referred to as being "connected" to another component, it can be directly or indirectly connected to the other component. When a component is indirectly connected to another component, it may be connected to the other component through a wireless communication network.

Also, it will be understood that when the terms "includes," "comprises," "including," and/or "comprising," when used in this specification, specify the presence of a stated component, but do not preclude the presence or addition of one or more other components.

In the entire specification, it will also be understood that when an element is referred to as being "on" or "over" another element, it can be directly on the other element or intervening elements may also be present.

It will be understood that, although the terms first, second, etc. may be used herein to describe various components, these components should not be limited by these terms. These terms are only used to distinguish one component from another.

It is to be understood that the singular forms "a," "an," and "the" include plural referents unless the context clearly dictates otherwise.

Additionally, it is understood that one or more of the below methods, or aspects thereof, may be executed by at least one controller. The term "controller" may refer to a hardware device that includes a memory and a processor. The memory is configured to store program instructions, and the processor is specifically programmed to execute the program instructions to perform one or more processes which are described further below. The controller may control operation of units, modules, parts, or the like, as described herein. Moreover, it is understood that the below methods may be executed by an apparatus comprising the controller in conjunction with one or more other components, as would be appreciated by a person of ordinary skill in the art.

Reference numerals used in operations are provided for convenience of description, without describing the order of the operations, and the operations can be executed in a different order from the stated order unless a specific order is definitely specified in the context.

Hereinafter, an operation principle and embodiments of the present disclosure will be described with reference to the accompanying drawings.

Figure 1:
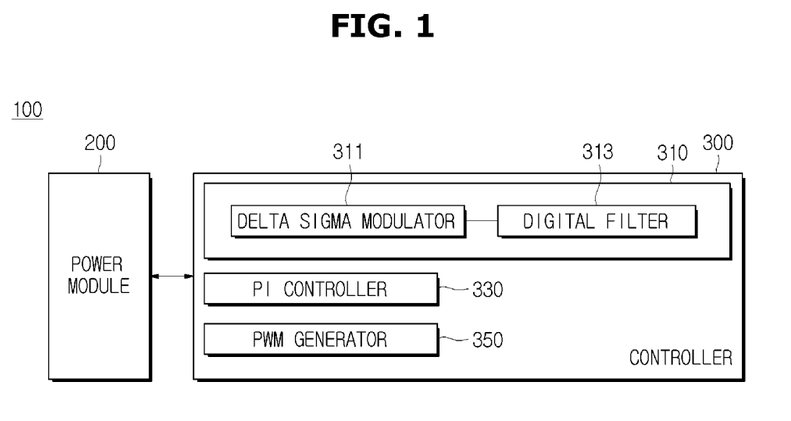
FIG. 1 is a control block diagram showing a configuration of a power conversion apparatus.

FIG. 1 is a control block diagram showing a configuration of a power conversion apparatus.

As shown in FIG. 1, a power conversion apparatus 100 may include a power module 200 and a controller 300.

Although not shown in FIG. 1, the power module 200 may include an inductor, a capacitor, a Field Effect Transistor (FET), and a gate driver to transfer an analog sensing signal corresponding to current of the inductor and a voltage applied at both terminals of the capacitor to the controller 300, and drive a power semiconductor with a pulse-width modulation signal transferred from the controller 300, thereby performing power conversion.

The controller 300 may convert the analog sensing signal received from the power module 200 to a digital signal to generate a pulse-width modulation signal, and transfer the pulse-width modulated signal to the power module 200.

As shown in FIG. 1, the controller 300 may include an Analog to Digital (A/D) converter 310, a PI controller 330, and a PWM generator 350.

The A/D converter 310 may convert an analog sensing signal to a digital signal through a delta-sigma modulation method.

The controller 300 may use sensing information converted to the digital signal by the A/D converter 310 as an input to generate a duty of an output through the PI controller 330 and the PWM generator 350. The duty may be defined as a value obtained by dividing one cycle (one period) of a PWM signal by on-time. The PWM modulation signal drives the FET which is a power semiconductor of the power module 200 to perform power conversion, thereby generating a required voltage or current as an output of the power conversion apparatus.

The A/D converter 310, the PI controller 330, and the PWM generator 350 may be implemented as a digital controller. However, some components of the A/D converter 310 may be installed outside the digital controller, instead of the inside of the digital controller, which will be described in detail, later. The digital controller may include a Field Programmable Gate Array (FPGA).

Referring still to FIG. 1, the A/D converter 310 may convert an analog sensing signal to a digital signal, and include a delta sigma modulator 311 for converting an analog input signal to a 1-bit signal through delta ($\Delta$) which is a difference between the analog input signal and a modulation signal that is feedback of the delta and a sigma ($\Sigma$) signal for integrating the delta $\Delta$, and a digital filter 313 for smoothing the 1-bit signal. The digital filter 313 may be a Cascaded Integrator Comb (CIC) filter.

The power conversion apparatus 100 may be a DC-DC converter.

Figure 2:
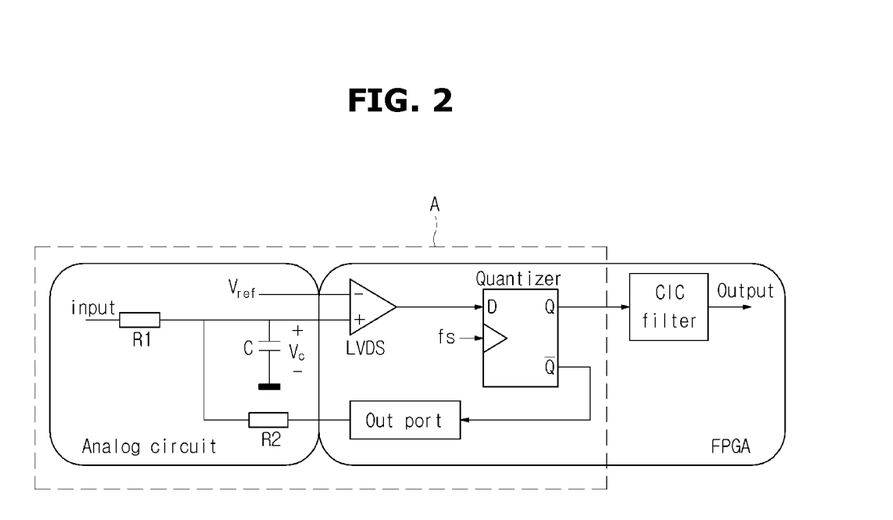
FIG. 2 is a circuit diagram showing a configuration of the A/D converter of FIG. 1.

FIG. 2 is a circuit diagram showing a configuration of the A/D converter 310 of FIG. 1.

As shown in FIG. 2, the delta sigma modulator 311 (e.g., 311 of FIG. 1 and A of FIG. 2) may include an analog circuit including an adder and an integrator implemented with a register R and a capacitor C, a comparator LVDS for outputting a signal transferred from the analog circuit as a 1-bit signal, a quantizer for oversampling the 1-bit signal transferred from the comparator LVDS, and an out port for RC-filtering the oversampled value to feed the RC-filtered result back as a delta input.

The analog circuit may include a first register R1 to which an analog input signal is input, a capacitor C connected to the first register R1 at one end, and a second register R2 connected between the first register R1 and the capacitor C at one end.

The comparator may include a Low Voltage Differential Signaling (LVDS) terminal which has a non-inverting input terminal connected to one end of the capacitor C as an input terminal.

The quantizer may include a Delay (D) flipflop including an input terminal connected to an output terminal of the LVDS terminal, a first output terminal connected to the digital filter (e.g., 313 of FIG. 1 and CIC filter of FIG. 2), and a second output terminal connected to the other end of the second register R2 through the out port.

If the controller (e.g., 300 of FIG. 1) is implemented as a digital controller, the analog circuit of FIG. 2 may be disposed outside the digital controller, and the comparator, the quantizer, the out port, and the digital filter may be disposed inside the digital controller.

That is, according to the present disclosure, an analog circuit of a simple configuration (R and C) may be disposed outside a digital controller to configure an adder and an integrator, and internal sources of the digital controller may be used to configure a comparator and a digital filter, thereby implementing a delta sigma modulation method.

The controller 300 may configure an analog circuit outside the digital controller, as well as inside the digital controller, to distribute the use of resources. That is, oversampled (e.g., tens to hundreds of samples of an analog signal frequency) 1-bit signal output values of the LVDS terminal and the D flipflop inside the digital controller may be downsampled through the CIC filter. The controller 300 can reduce resources compared to when a commercial IP is used, since the controller 300 uses only a register except for the CIC filter upon delta sigma modulation.

Figure 3:
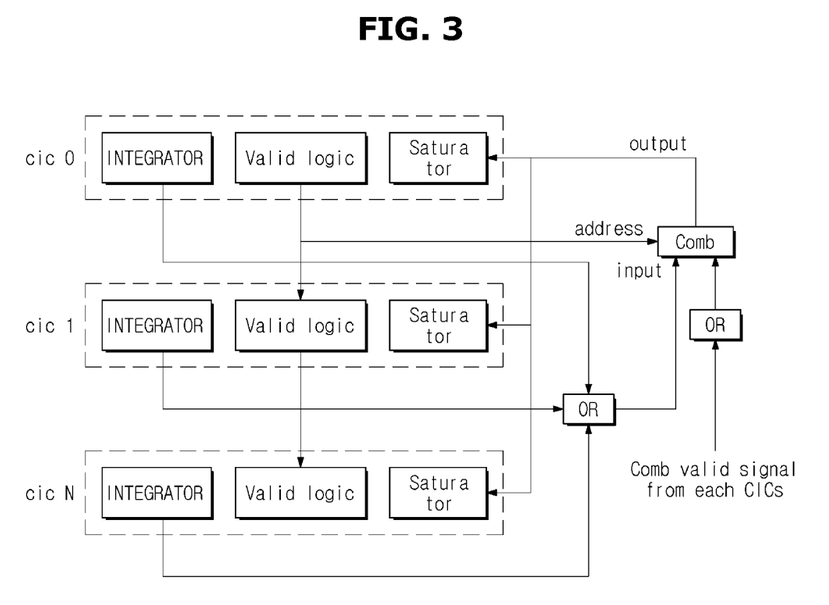
FIG. 3 is a block diagram showing a configuration of the digital filter of FIG. 2.
Figure 4:
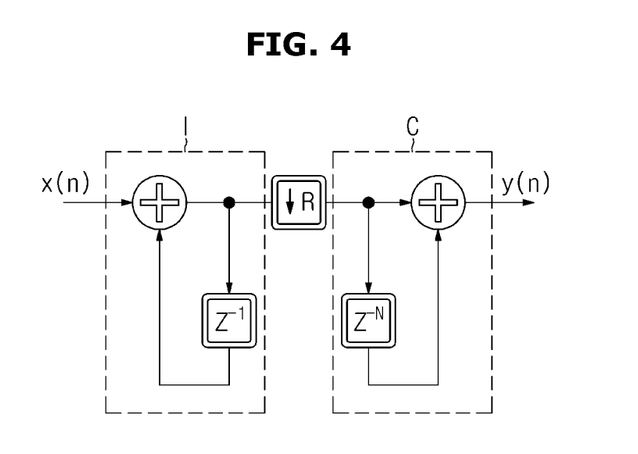
FIG. 4 shows a structure of a single CIC filter.
Figure 5:
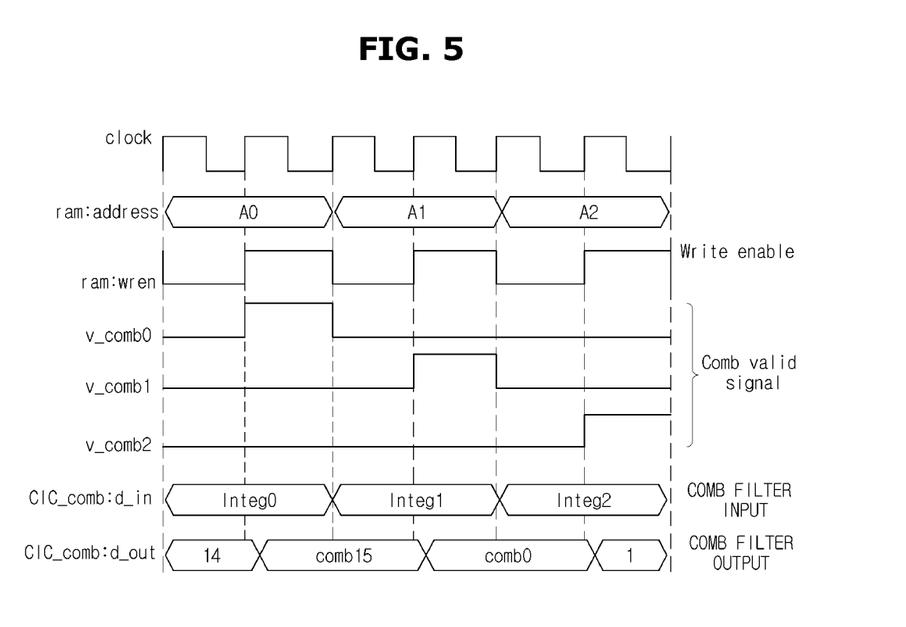
FIGS. 5 and 6 are views for describing a method of controlling a power conversion apparatus.
Figure 6:
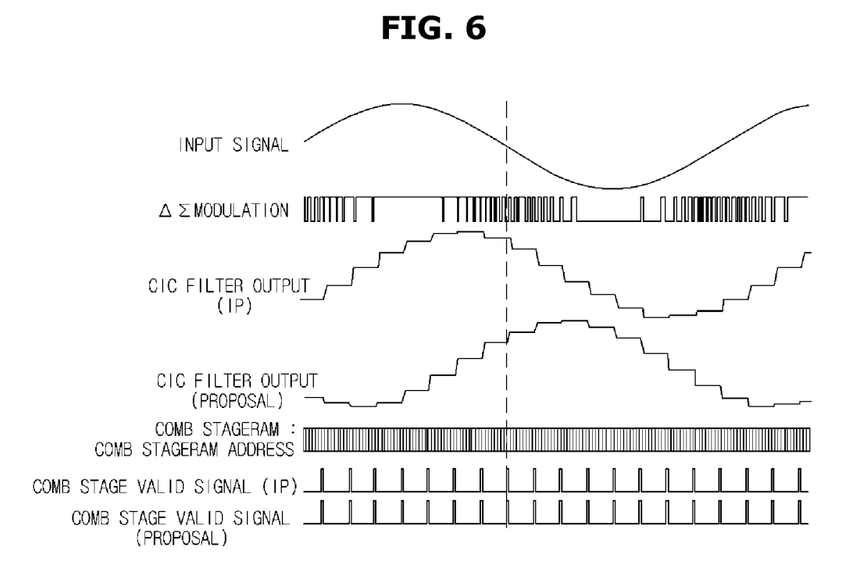

FIG. 3 is a block diagram showing a configuration of the digital filter of FIG. 2, FIG. 4 shows a structure of a single CIC filter, and FIGS. 5 and 6 are views for describing a method of controlling a power conversion apparatus.

In the present disclosure, the digital filter (e.g., 313 of FIG. 1) may be a CIC filter. The CIC filter may use resources efficiently, since it can express all coefficients as "1" and accordingly, multiplying operations for coefficients can be omitted, compared to a Finite Impulse Response (FIR) filter.

Referring first to FIG. 3, the digital filter 313 may remove high frequency signals through a Low Pass Filter (LPF) to reduce the oversampled frequency, thereby reducing a sampling rate.

As shown in FIG. 3, the digital filter 313 may be configured with a filter of a predetermined order, by including a plurality of integrator stages cic 0, cic 1, and cic N for selectively providing outputs from a predetermined number of integrators sequentially as an input of a common Comb filter, and a comb stage Comb for generating a comb valid signal in synchronization with a decimation ratio of the integrator stages and selectively applying an input according to predetermined criteria for outputs from the integrator stages when a signal is generated to thus provide a final output.

The operation principle of the digital filter 313 may be high-frequency signal (fs)→h(z)→↓R→low-frequency signal (fs/R). Herein, h(z) may be a transfer function of the CIC filter, and R may be a decimation ratio.

The transfer function h(z) of the CIC filter may be expressed by Equation (1) below.

$$h(z) = \left[ \sum_{i=0}^{RM-1} z^{-i} \right]^N = \frac{(1-z^{RM})^N}{(1-z^{-1})^N} \quad (1)$$

$$\frac{1}{1-z^{-1}} \to \cdots \to \frac{1}{1-z^{-1}} \to R\downarrow \to (1-z^{-M}) \to \cdots \to (1-z^{-M})$$

The transfer function h(z) of the CIC filter may be represented by N integrator stages corresponding to a denominator and N comb stages corresponding to a numerator, as seen in Equation (1). A sampling frequency may be reduced by the decimation ratio R. In Equation (1), N represents an order of the filter, and M represents a delay of the comb stage to be a value of "1" or "2".

Referring next to FIG. 4, the structure of the single CIC filter may include an integrator stage I and a Comb stage C. In this case, N is D/R, wherein R represents a decimation ratio and D represents a delay.

The digital filter 313 may reduce a sampling rate of an original signal fs to generate a decimated signal fs/R.

Operation timings of the Comb stage of FIG. 3 may be shown in FIG. 5.

The digital filter 313 may include Random Access Memory (RAM) for storing inputs and outputs from the integrator stages and the comb stage.

The RAM may selectively store outputs from the integrator stages in the corresponding addresses according to criteria set in advance by a valid signal.

When a N-order CIC filter is used, the Comb filter may share address input internal RAM by using decimation.

Referring again to FIG. 3, outputs from the N integrators may be selectively and sequentially used as inputs of the common Comb filter. Although the Comb filter needs to operate by the same number of stages as the integrators, there may be space relatively since a sampling rate at which the Comb filter operates has been reduced. Referring to FIG. 5, the comb stage may generate a comb valid signal v_comb0, v_comb1, and v_comb2 in synchronization with a decimation ratio to selectively receive outputs from the integrator stages when a signal is generated, thereby providing a final output d_out.

Simulation results of the A/D converter 310 are shown in FIG. 6.

In FIG. 6, IP corresponds to a case in which ADC IP is applied upon A/D conversion in the digital controller, and Proposal corresponds to a case in which the CIC filter and the delta sigma method according to the present disclosure are applied.

The controller 300 may be implemented with memory (not shown) that stores algorithms for controlling the operations of components in the power conversion apparatus 100 or data for programs for executing the algorithms, and a processor (not shown) that performs the above-described operations using the data stored in the memory. The memory and the processor may be implemented as separate chips. Alternatively, the memory and the processor may be integrated into a single chip.

Figure 7:
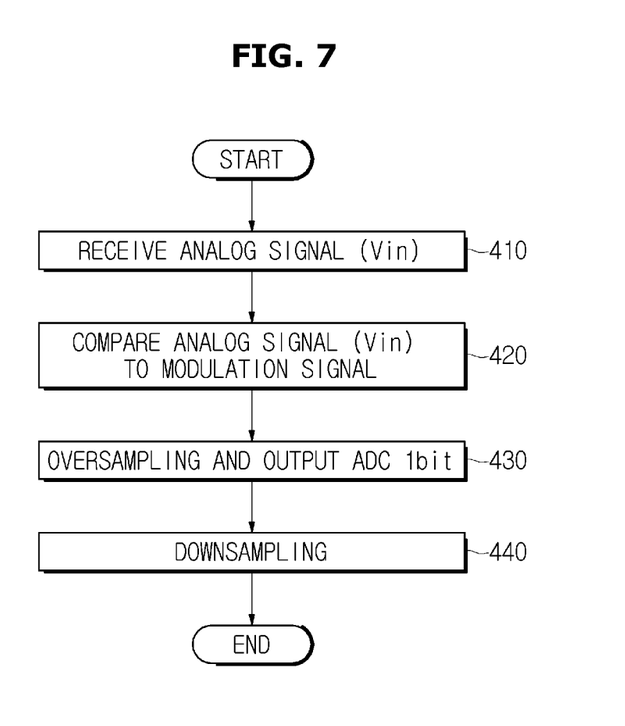
FIGS. 7 and 8 are flowcharts illustrating a method of controlling a power conversion apparatus.
Figure 8:
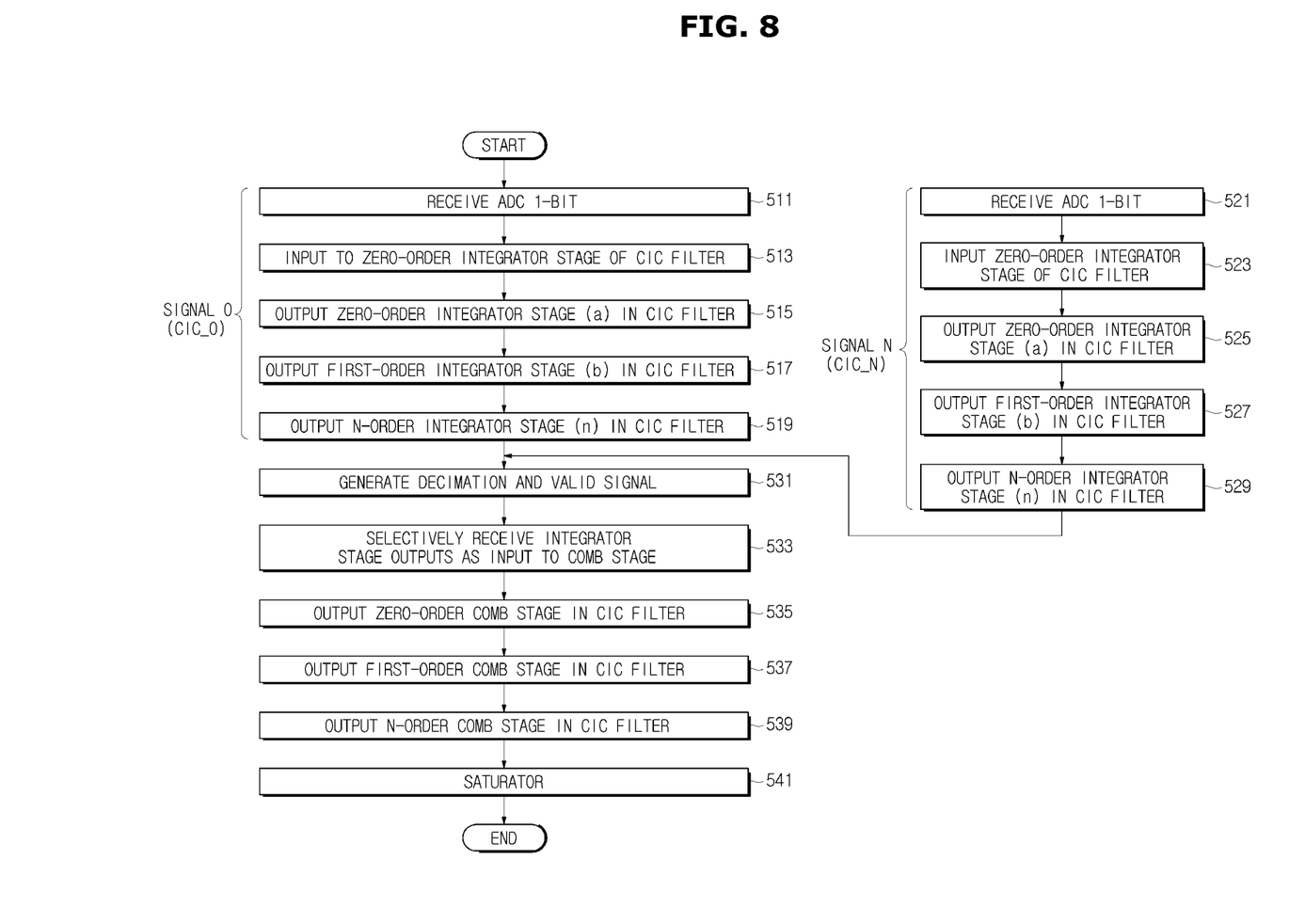

FIGS. 7 and 8 are flowcharts illustrating a method of controlling a power conversion apparatus.

FIG. 7 is a view for describing an example of an A/D conversion process using delta sigma modulation in a digital controller.

As shown in FIG. 7, the controller 300 of the power conversion apparatus may receive an analog input signal Vin from the power module 200, in operation 410.

Then, the controller 300 may compare the analog input signal Vin to a modulation signal to output a 1-bit signal, in operation 420.

Thereafter, the controller 300 may oversample the 1-bit signal to output the oversampled 1-bit signal as an ADC 1 bit, in operation 430.

Then, the controller 300 may downsample the oversampled 1-bit signal to complete A/D conversion, in operation 440.

Although not shown in FIG. 7, the oversampled signal may be subjected to RC-filtering (DAC), and then feed back as a delta input (returning to operation 420).

Referring next to FIG. 8, downsampling of operation 440 of FIG. 7 may be performed as follows.

FIG. 8 is a view for describing an example of a case in which a CIC filter is implemented in a digital controller.

As shown in FIG. 8, the controller 300 of the power conversion apparatus may receive the 1-bit signal (ADC 1-bit signal) in operation 511, and input the 1-bit signal to a zero-order integrator stage of the CIC filter, in operation 513.

Then, the controller 300 may sequentially perform the integration stage output s (a), (b), and (c) from zero-order to predetermined number (N)-order of the CIC filter, in operations 515 to 519. The operations 511 to 519 may mean the concept of a $N^{th}$-order CIC filter.

Meanwhile, the controller 300 may selectively input output values of N sensing signals from the integrator stages to Comb filters by the valid signal, when there are CIC filters of CIC_0 to CIC_N, for A/D conversion of the N sensing signals, in operations 521 to 529 (see FIG. 3).

Then, the controller 300 may generate a decimation signal and a valid signal, in operation 531.

Then, the controller 300 may receive the outputs from the integrator stages as an input (a), (b), . . . , or (n) to the comb stage, selectively, according to predetermined criteria, in operation 533.

Then, the controller 300 may sequentially perform the comb stages output from zero-order to predetermined number (N)-order in the CIC filter, in operations 535 to 539.

Then, the controller 300 may apply a saturator to use a value in a valid range, in operation 541. However, the operation 541 may be not necessarily performed, and may be omitted.

At this time, the controller 300 may store operation values in the internal RAM, instead of a register. The comb stage reduces a sampling rate by R (decimation ratio) compared to the integrator stages. Accordingly, the controller 300 may not operate the comb stage simultaneously with the integrator stages, since simultaneously operating every cycle is not necessary. The comb stage may share the RAM sequentially according to order. In this case, a level of sharing may be about 0.5 times of R. The outputs from the integrator stages may be stored in the corresponding addresses of the RAM selectively by a valid signal. The valid signal may be synchronized with the decimation ratio.

The comb stage may receive the inputs selectively by the valid signal, and process operations, thereby increasing the use efficiency of resources.

According to the above-described embodiments, it is possible to reduce the utilization of digital controller resources upon analog-to-digital conversion in the digital controller.

Meanwhile, the above-described embodiments may be embodied in the form of a non-transitory computer-readable recording medium to store commands executable by a computer. The commands may be stored in the form of program codes, and when executed by a processor, the commands can create a program module to perform operations of the embodiments. The recording medium may be embodied as computer-readable recording medium. The computer-readable recording medium may include all kinds of recording media storing commands that can be decoded by a computer. For example, the computer-readable recording medium may be Read Only Memory (ROM), Random Access Memory (RAM), a magnetic tape, a magnetic disk, flash memory, an optical data storage device, or the like.

Although certain embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A power conversion apparatus comprising:
a power module configured to transfer an analog sensing signal corresponding to a current of an inductor and a voltage applied at both terminals of a capacitor, and to perform power conversion by driving a power semiconductor with a pulse-width modulation signal; and a controller configured to receive the analog sensing signal from the power module, to convert the analog sensing signal to a digital signal, to generate the pulse-width modulation signal, and to transfer the pulse-width modulation signal to the power module, wherein the controller includes an Analog to Digital (A/D) converter having a delta sigma modulator configured to convert the analog sensing signal to the digital signal by converting an analog input signal to a 1-bit signal through a delta and a sigma signal for integrating the delta, wherein the delta is a difference between the analog input signal and a modulation signal, and a digital filter configured to smooth the 1-bit signal, and wherein the digital filter includes:
- a plurality of integrator stages configured to sequentially provide outputs of a predetermined number of integrators as input of a common Comb filter, and a comb stage configured to generate a valid signal in synchronization with a decimation ratio of the plurality of integrator stages, and to selectively receive the outputs of the predetermined number of integrators according to a criteria set by the valid signal, and to provide a final output; and
- a random access memory (RAM) configured to store the outputs of the predetermined number of integrators in corresponding addresses according to the criteria set by the valid signal.

2. The power conversion apparatus of claim 1, wherein the digital filter is a Cascaded Integrator Comb (CIC) filter.

3. The power conversion apparatus of claim 1, wherein the delta sigma converter includes:
- an analog circuit including an adder and an integrator implemented with a resistor and a capacitor;
- a comparator configured to output a signal transferred from the analog circuit as the 1-bit signal;
- a quantizer configured to oversample the 1-bit signal transferred from the comparator; and
- an out port configured to RC-filter the oversampled value, and to feed the RC-filtered value back as a delta input.

4. The power conversion apparatus of claim 3, wherein the analog circuit includes a first resistor configured to receive the analog input signal, a capacitor connected to the first resistor at one end thereof, and a second resistor connected between the first resistor and the capacitor at one end thereof.

5. The power conversion apparatus of claim 4, wherein the comparator includes a Low Voltage Differential Signaling (LVDS) terminal having a non-inverting input terminal connected to one end of the capacitor as an input terminal.

6. The power conversion apparatus of claim 5, wherein the quantizer includes a Delay (D) flipflop including an input terminal connected to an output terminal of the LVDS terminal, a first output terminal connected to the digital filter, and a second output terminal connected to the other end of the second resistor through the out port.

7. The power conversion apparatus of claim 3, wherein, when the controller is implemented as a digital controller, the analog circuit is disposed outside the digital controller, and the comparator, the quantizer, the out port, and the digital filter are disposed inside the digital controller.

8. An Analog to Digital (A/D) converter comprising:
- a delta sigma modulator configured to convert an analog sensing signal to a digital signal by converting an analog input signal to a 1-bit signal through a delta and a sigma signal for integrating the delta, wherein the delta is a difference between the analog input signal and a modulation signal; and
- a digital filter configured to smooth the 1-bit signal, wherein the digital filter includes:
- a plurality of integrator stages configured to sequentially provide outputs of a predetermined number of integrators as input of a common Comb filter, and a comb stage configured to generate a valid signal in synchronization with a decimation ratio of the plurality of integrator stages, and to selectively receive the outputs of the predetermined number of integrators according to a criteria set by the valid signal, and to provide a final output; and
- a random access memory (RAM) configured to store the outputs of the predetermined number of integrators in corresponding addresses according to the criteria set by the valid signal.

9. The A/D converter of claim 8, wherein the digital filter is a Cascaded Integrator Comb (CIC) filter.

10. The A/D converter of claim 8, wherein the delta sigma modulator includes:
- an analog circuit including an adder and an integrator implemented with a resistor and a capacitor;
- a comparator configured to output a signal transferred from the analog circuit as a 1-bit signal;
- a quantizer configured to oversample the 1-bit signal transferred from the comparator; and
- an out port configured to RC-filter the oversampled value, and to feed the RC-filtered value back as a delta input.

11. The A/D converter of claim 10, wherein, when the A/D converter is implemented as a digital controller, the analog circuit is disposed outside the digital controller, and the comparator, the quantizer, the out port, and the digital filter are disposed inside the digital controller.

* * * * *